(12) United States Patent
Xie

(10) Patent No.: US 7,936,059 B1
(45) Date of Patent: May 3, 2011

(54) LEAD FRAME PACKAGING TECHNIQUE WITH REDUCED NOISE AND CROSS-TALK

(75) Inventor: Yuanlin Xie, Femont, CA (US)

(73) Assignee: Altera Corporation, San Jose, CA (US)

( * ) Notice: Subject to any disclaimer, the term of this patent is extended or adjusted under 35 U.S.C. 154(b) by 379 days.

(21) Appl. No.: 11/676,864

(22) Filed: Feb. 20, 2007

(51) Int. Cl.
*H01L 23/495* (2006.01)
*H01L 23/498* (2006.01)
*H01L 23/28* (2006.01)
*H01L 23/48* (2006.01)
*H01L 23/31* (2006.01)

(52) U.S. Cl. ......... 257/691; 257/E23.036; 257/E23.041; 257/E23.043; 257/E23.037; 257/E23.057; 257/E23.07; 257/672; 257/676; 257/666; 257/787

(58) Field of Classification Search ................. 257/666, 257/691, 672, 676, E23.036, E23.041, E23.043, 257/668, 674, 787, E23.037, E23.057, E23.07
See application file for complete search history.

(56) References Cited

U.S. PATENT DOCUMENTS

| | | | | |
|---|---|---|---|---|
| 5,134,246 A * | 7/1992 | Beppu et al. | ................. | 174/536 |
| 5,283,717 A * | 2/1994 | Hundt | ............................ | 361/813 |
| 5,291,059 A | 3/1994 | Ishitsuka et al. | | |
| 5,294,897 A * | 3/1994 | Notani et al. | .................... | 333/33 |
| 5,386,141 A * | 1/1995 | Liang et al. | .................... | 257/676 |
| 5,389,816 A * | 2/1995 | Shimizu et al. | ............... | 257/666 |
| 5,508,556 A * | 4/1996 | Lin | ................................ | 257/691 |
| 5,648,679 A * | 7/1997 | Chillara et al. | ................ | 257/666 |
| 5,756,380 A * | 5/1998 | Berg et al. | ...................... | 438/126 |
| 5,800,958 A * | 9/1998 | Manteghi | ...................... | 438/123 |
| 6,031,280 A * | 2/2000 | Sakoda | .......................... | 257/692 |
| 6,087,842 A * | 7/2000 | Parker et al. | .................. | 324/763 |
| 6,198,168 B1 * | 3/2001 | Geusic et al. | ................. | 257/774 |
| 6,271,583 B1 * | 8/2001 | Sakoda et al. | ................ | 257/693 |
| 6,300,161 B1 | 10/2001 | Goetz et al. | | |
| 7,049,696 B2 * | 5/2006 | Kubo | ............................ | 257/706 |
| 7,723,836 B2 * | 5/2010 | Kwon et al. | ................... | 257/690 |
| 2004/0012099 A1 * | 1/2004 | Nakayama | .................... | 257/787 |
| 2004/0021220 A1 * | 2/2004 | Kubo | ............................ | 257/706 |
| 2006/0237831 A1 * | 10/2006 | Danno et al. | .................. | 257/678 |

FOREIGN PATENT DOCUMENTS

| | | | |
|---|---|---|---|
| JP | 5-95070 | * | 4/1993 |
| JP | 6-260579 | * | 9/1994 |
| JP | 6-302757 | * | 10/1994 |
| JP | 7-335785 | * | 12/1995 |

\* cited by examiner

*Primary Examiner* — Alexander O Williams
(74) *Attorney, Agent, or Firm* — Martine Penilla & Gencarella, LLP

(57) ABSTRACT

Broadly speaking, the present invention fills these needs by providing a lead frame package including a substrate stack having opposed sides, one of which includes a plurality of signal traces, with the remaining side including a ground plane. An integrated circuit is mounted to the substrate stack. The integrated circuit includes a plurality of bond pads. A plurality of leads is in electrical communication with a subset of the plurality of signal traces. A plurality of electrically conductive elements placing a sub-group of the plurality of bond pads in electrical communication with a sub-part of the plurality of electrically leads by being bonded signal traces of the subset, spaced-apart from the plurality of leads.

18 Claims, 2 Drawing Sheets

LEAD FRAME PACKAGING TECHNIQUE WITH REDUCED NOISE AND CROSS-TALK

BACKGROUND OF THE INVENTION

This invention relates to packaging for integrated circuits and more particularly to lead package for integrated circuits.

Typically the final process in the manufacture of an integrated circuit, packaging of an integrated circuit is attendant with several challenges that may prevent obtaining the intended operational characteristics of the integrated circuit. Packaging of an integrated circuit involves mechanically mounting the integrated circuit to the package and providing electrical connections between the integrated circuit and conductors of the package, typically called leads, to facilitate signal transmission between the integrated circuit and circuits outside of the package.

Referring to FIGS. 1 and 2, a typical lead package 10 includes a die pad 12, an integrated circuit 14 fixedly attached to die pad 12 with an adhesive compound 16 such as epoxy or solder. Package 10 includes a plurality of conductive leads 18 in electrical communication with integrated circuit 14 with one or more conductive wires 20. Die pad 12, integrated circuit 14, conductive wires 20, and a portion of conductive leads 18 are encapsulated with a suitable material, such as resin 22, with the remaining portion of leads 18 being exposed. In this manner, resin 22 hermetically seals die pad 12, integrated circuit 14, conductive wires 20, and a portion of conductive leads 18.

Drawbacks with this configuration are manifold. Firstly cross-talk between adjacent signal paths is difficult to control due to the inability to control the length of the wire 20, the pitch of leads and the integrated circuit input/output (I/O) impedance. Secondly, hermetically sealing the die pad 12 and integrated circuit 14 makes heat dissipation problematic.

A need exists, therefore, to provide an improved lead package for integrated circuits that overcomes the drawbacks of the prior art.

SUMMARY OF THE INVENTION

Broadly speaking, the present invention fills these needs by providing a lead frame package including a substrate stack having opposed sides, one of which includes a plurality of signal traces, with the remaining side including a ground plane. An integrated circuit is mounted to the substrate stack. The integrated circuit includes a plurality of bond pads. A plurality of leads is in electrical communication with a subset of the plurality of signal traces. A plurality of electrically conductive elements placing a sub-group of the plurality of bond pads in electrical communication with a sub-part of the plurality of electrically leads by being bonded to signal traces of the subset, spaced-apart from the plurality of leads. It should be appreciated that the present invention can be implemented in numerous ways, including as a process, an apparatus, a system, a device, or a method. Several inventive embodiments of the present invention are described below.

BRIEF DESCRIPTION OF THE DRAWINGS

The present invention will be readily understood by the following detailed description in conjunction with the accompanying drawings, and like reference numerals designating like structural elements.

DETAILED DESCRIPTION OF THE INVENTION

In the following description, numerous specific details are set forth in order to provide a thorough understanding of the present invention. However, it will be apparent to one skilled in the art that the present invention may be practiced without some of these specific details. In other instances, well known process operations and implementation details have not been described in detail in order to avoid unnecessarily obscuring the invention.

Figure 1:
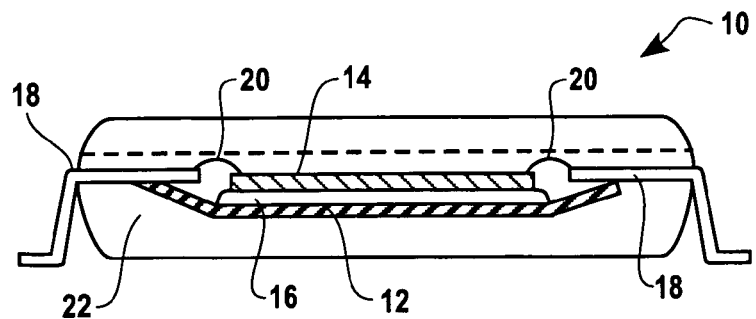
FIG. 1 is a cross-sectional view of a prior art lead frame package.
Figure 2:
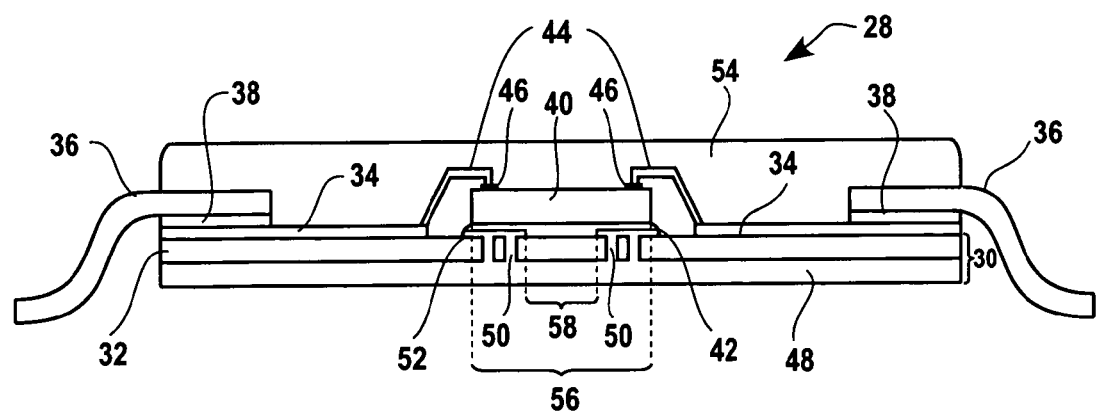
FIG. 2 is a cross-sectional view of a lead frame package in accordance with the present invention.

FIG. 2 shows a lead frame package 28 in accordance with one embodiment of the present invention that includes a substrate stack 30 having a substrate 32 and a plurality of signal traces 34 disposed on substrate 32. Signal traces 34 are electrically conductive and formed from any suitable material, such as aluminum, gold, copper and the like. In electrical communication with signal traces are electrically conductive leads 36. Leads are adhered to signal traces 34 using any suitable means, such as solder, or conductive epoxy that is shown as 38. An integrated circuit 40 is attached to substrate stack 30 using a suitable adhesive 42, such as conductive epoxy, solder and the like. Electrically conductive elements 44 place integrated circuit 40 in electrical communication with signal traces 34. To that end, one end of electrically conductive elements 44 are bonded to bonding pads 46 of integrated circuit 40, with the remaining end of electrically conductive elements 44 being bonded to signal traces 34. Bonding pads 46 are shown raises in an exaggerated manner for clarity. In practice, bonding pads 46 may be substantially flush with an upper surface of integrated circuit 40. Electrically conductive elements 44 may be provided using well known interconnection techniques, such as tape automated bonding (TAB), wire bonding and the like. Disposed on one side of substrate 32, opposite to signal traces 34, is a ground plane 48 that is electrically conductive. Ground plane 48 is configured so that an entire area of each of signal traces 34 is in superimposition therewith. A plurality of conductive throughways 50 extend from ground plane 48 toward integrated circuit 40, terminating in a terminus 52 proximate to adhesive 42. Specifically, adhesive 42 is disposed so that a portion is positioned between integrated circuit 40 and a terminus 52.

Figure 3:
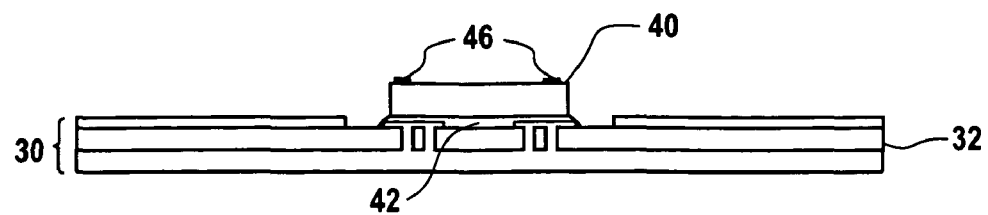
FIG. 3 is a simplified top down view of a portion of the lead frame package shown in FIG. 2, in accordance with the present invention.

Referring to both FIGS. 2 and 3, during operation signals propagate from integrated circuit 40 to leads 36 through conductive elements 44 and signal traces 34. By providing ground plane 48 in superimposition with signal traces 34 it is possible to decrease the distance between adjacent signal traces 34 and, therefore adjacent electrically conductive elements 44 while reducing the probability of cross-talk between signals propagating on adjacent signal traces 34. As is well known, cross-talk results from mutual capacitive coupling between adjacent conductors caused by current propagating thereon. In the present invention, the position of signal traces 24 with respect to ground plane 48 may be established to maximize the probability that the return path or the current in a signals propagating along signal traces 34 is not along an adjacent signal trace 34; rather, the return path for the signal will be in ground plane 48. The distance between the signal trace 34 and a portion of ground plane 48 in superimposition therewith, is defined by the thickness of the region of substrate 32 disposed the therebetween. Thus, by forming substrate 32 from a material with a suitable dielectric constant and with a desired thickness, adjacent signal traces 34 may be provided with a pitch that is substantially less than the pitch associated with adjacent leads 36 and without unduly increasing the probability of signal cross-talk. The presence of signal traces also facilitates further reduction in the potential for crosstalk of signals propagating a long adjacent signal traces by affording a reduction in and the length of electrically conductive elements 44 compared with the prior art, due to, inter alia, a reduction in the pitch of signal traces 34 and the proximity thereof with respect to integrated circuit 40.

Figure 4:
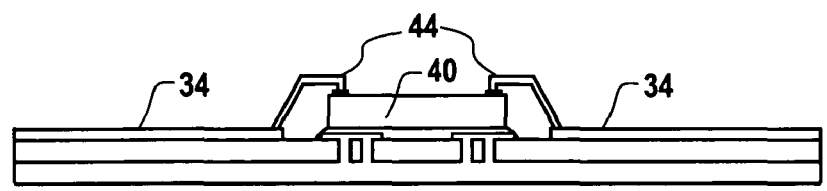
FIG. 4 is a cross-sectional view showing attachment of an integrated circuit to a substrate in furtherance of fabricating the lead frame package shown in FIG. 2, in accordance with the present invention.
Figure 5:
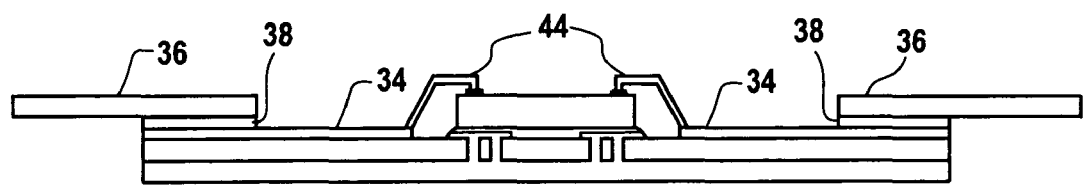
FIG. 5 is a cross-sectional view showing the attachment electrically conductive elements between the integrated circuit and the substrate shown in FIG. 4 in accordance with the present invention.
Figure 6:
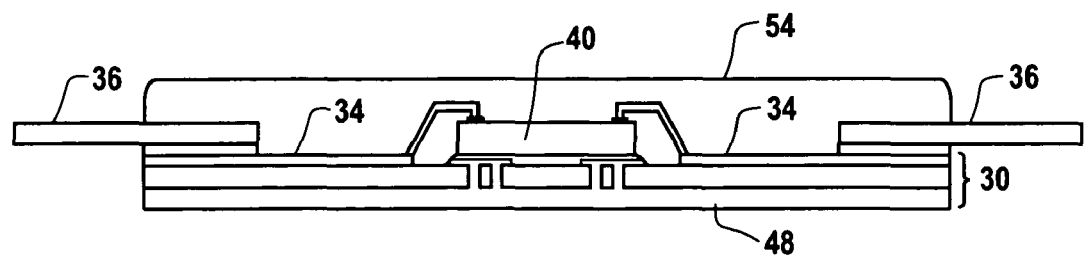
FIG. 6 is a cross-sectional view showing attachment of leads to the substrate, shown in FIG. 5, in accordance with the present invention.

Referring to both FIGS. 2 and 3, the fabrication of lead frame package 10 includes attaching integrated circuit 40 to substrate stack 30. This may be achieved by the use of epoxy 42 disposed between substrate stack 30 and integrated circuit 40. Thereafter as shown in FIG. 4, integrated circuit 40 is placed in electrical communications with signal traces 34 using suitable wire bonding techniques to produce electrically conductive elements 44. As shown in FIG. 5, leads 36 are coupled to signal traces 34 using adhesive 38 after electrically conductive elements 44 have been attached. Following attachment of leads 36 suitable encapsulation material 54 is disposed to cover a portion of leads 36, the entirety of electrically conductive elements 44, the entirety of integrated circuit 40 and exposed portions of signal traces 34 thereby hermetically sealing a side of substrate stack 30 positioned opposite ground plane 48.

An additional benefit provided by the present configuration is that the presence of conductive throughway 50 and ground plane 48 provides an efficient path for thermal energy to propagate away from integrated circuit 40. As is well known, current produced by integrated circuit 40, during operation, generates thermal energy that encapsulation 54 typically does not propagate away from integrated circuit 40 in an efficient manner. This is due to the material from which substrate 32 is formed, e.g., printed circuit board (PCB) material. PCB material is not an efficient thermal conductor. By forming epoxy 42, through ways 50 and ground plane from a material that is thermally conductive, the thermal energy generated by integrated circuit 40 may be dissipated. As a result, a region 56 upon which integrated circuit 40 is mounted includes a thermally insulative region 58 a thermally conductive region defined by termini 52 of through ways 50. In one embodiment, ground plane 48 and through ways 50 are integrally formed from copper so as to provide efficient thermal and electrical conductivity. Finally, it is contemplated that ground plane 48 is coextensive with substrate 32.

The foregoing description is exemplary and it should be understood that many variations and modifications to the above-described invention are contemplated herein. The scope of the invention should, therefore, be limited with reference to the above description, but instead should be determined with reference to the appended claims along with their full scope of equivalents.

What is claimed is:

1. A lead frame package comprising:
    a substrate stack having opposed sides, one of which includes a plurality of signal traces, with the remaining side including an electronically conductive ground plane;
    an integrated circuit mounted to a region of said substrate stack, said integrated circuit including a plurality of pads, said integrated circuit thermally coupled with said ground plane through a plurality of thermally conductive throughways disposed underneath said integrated circuit, wherein said region includes a thermally insulative portion and a thermally conductive portion;
    a plurality of leads in electrical communication with a subset of said plurality of signal traces; and
    a plurality of electrically conductive elements placing a sub-group of said plurality of pads in electrical communication with a sub-part of said plurality of leads by being bonded to said subset of said plurality of signal traces, said subset of said plurality of signal traces spaced-apart from said plurality of leads.

2. The package as recited in claim 1 wherein said ground plane is in superimposition with the signal traces of said subset, and wherein said ground plane and said plurality of thermally conductive throughways are composed of the same material.

3. The package as recited in claim 1 wherein said plurality of leads are coupled to the signal traces of said subset with a conductive epoxy.

4. The package as recited in claim 1 wherein said ground plane is spaced-apart from the signal traces of said subset a first distance with adjacent electrically conductive elements being spaced-apart a second distance, greater than said first distance.

5. The package as recited in claim 1 wherein a portion of each of said plurality of electrically conductive elements is in superimposition with said first side, with an entire area of said first side and components in superimposition with said first side being encapsulated, with said second side being exposed.

6. The package as recited in claim 1 wherein said ground plane comprises thermally conductive material.

7. The package as recited in claim 1, wherein said plurality of thermally conductive throughways extend to said region and to said ground plane.

8. The package as recited in claim 1 wherein said plurality of signal traces are associated with a first pitch and said plurality of conductive leads are associated with a second pitch, said second pitch is greater than said first pitch.

9. A lead frame package comprising:
    a substrate stack having first and second opposed sides, with said first side including a plurality of spaced-apart signal traces;
    an integrated circuit mounted to a region of said substrate stack, said integrated circuit including a plurality of pads;
    a plurality of thermally conductive throughways disposed underneath said integrated circuit and extending through a thermally insulative portion of said region to a ground plane;
    a plurality of leads in electrical communication with said signal traces; and
    a communication channel extending between a sub-group of said pads and a sub-portion of said leads, said communication channel operable to propagate signals from said plurality of pads to said plurality of leads.

10. The package as recited in claim 9 wherein said thermally conductive throughways propagate heat generated by said integrated circuit away from said package by conduction, and said ground plane and said plurality of thermally conductive throughways are composed of the same material.

11. The package as recited in claim 9 wherein said means for controlling further includes a plurality of electrically conductive elements placing a sub-group of said plurality of pads in electrical communication with a sub-part of said plurality of leads by being bonded to portions of signal traces of said subset, spaced-apart from said plurality of leads.

12. The package as recited in claim 9 wherein said ground plane is disposed upon said second opposed side, spaced-apart from, and in superimposition with, said signal traces.

13. The package as recited in claim 12 further includes encapsulation in superimposition with said first side so that an entire area of said first side and components in superimposition with said first side are sealed by said encapsulation, with said second side being exposed.

14. A method for packaging an integrated circuit having a plurality of pads mounted to a region of a substrate stack having first and second opposed sides, with said first side including a plurality of spaced-apart signal traces, said method comprising:
  placing a plurality of leads in electrical communication with said signal traces, said plurality of leads disposed over a portion of said signal traces;
  controlling free-space coupling, between said plurality of leads, of signals propagating from said plurality of pads to said plurality of leads by placing a return signal path proximate to said signal traces; and
  defining a plurality of thermally conductive throughways extending underneath said integrated circuit through a thermally insulative portion of said region of the substrate stack to a ground plane.

15. The method as recited in claim 14 further including propagating heat generated by said integrated circuit away from said integrated circuit by conduction.

16. The method as recited in claim 14 wherein said controlling free-space coupling further includes placing a plurality of leads in electrical communication with a subset of said plurality of signal traces through one of conductive epoxy or solder and bonding an electrically conductive element between each of a sub-group of said plurality of pads and a signal trace of said subset, with said electrically conductive element being bonded to a portion of said signal trace of said subset so as to be spaced-apart from the lead in electrical communication therewith.

17. The method as recited in claim 14 wherein said controlling further includes disposing a ground plane upon said second opposed side in superimposition with said signal traces.

18. The method as recited in claim 17 wherein further including propagating heat generated by said integrated circuit away from said integrated circuit by encapsulating said first side so that an entire area of said first side and components in superimposition with said first side are sealed by encapsulation, with said second side being exposed and extending said plurality of thermally conductive throughways between said region and said ground plane.

* * * * *